United States Patent
Hao

(10) Patent No.: US 6,316,322 B1
(45) Date of Patent: Nov. 13, 2001

(54) METHOD FOR FABRICATING SEMICONDUCTOR DEVICE

(75) Inventor: Ming Yin Hao, Sunnyvale, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/511,902

(22) Filed: Feb. 23, 2000

Related U.S. Application Data
(60) Provisional application No. 60/155,546, filed on Sep. 24, 1999.

(51) Int. Cl.$^7$ .................................................. H01L 21/336
(52) U.S. Cl. ................................................................ 438/305
(58) Field of Search ..................................... 438/305, 301, 438/303

(56) References Cited

U.S. PATENT DOCUMENTS

| | | | |
|---|---|---|---|
| 5,407,848 | * | 4/1995 | Park et al. . |
| 5,491,099 | * | 2/1996 | Hsu ...................................... 438/305 |
| 5,527,725 | * | 6/1996 | Park . |
| 5,538,909 | * | 7/1996 | Hsu . |
| 5,956,590 | * | 9/1999 | Hsieh et al. .......................... 438/303 |
| 5,972,762 | * | 10/1999 | Wu ....................................... 438/305 |
| 6,013,554 | * | 1/2000 | Park ..................................... 438/305 |
| 6,071,783 | * | 6/2000 | Liang et al. .......................... 438/301 |
| 6,121,100 | * | 9/2000 | Andideh et al. ...................... 438/305 |

OTHER PUBLICATIONS

Wolf, "Silicon Processing for the VLSI Era vol. 2: Process Integration", pp. 389–391, Lattice Press, 1990.*

* cited by examiner

Primary Examiner—Richard Booth

(57) ABSTRACT

Submicron-dimensioned devices are formed whereby a desired relationship between the impurity concentration peak and a lightly doped source/drain region is obtained.

7 Claims, 2 Drawing Sheets

METHOD FOR FABRICATING SEMICONDUCTOR DEVICE

RELATED APPLICATIONS

This application claims priority from U.S. Provisional Application Serial No. 60/155,546, filed Sep. 24, 1999, which is incorporated herein by reference.

TECHNICAL FIELD

The present invention relates to a method of forming source/drain regions in a semiconductor substrate, whereby a desired relationship between the impurity concentration peak and a lightly doped source/drain region is obtained. The present invention has particular utility in the manufacture of MOS-type transistor devices and semiconductor integrated circuits with improved processing methodology resulting in increased reliability and quality, increased manufacturing throughput, and reduced fabrication cost. The present invention is also useful in the manufacture of CMOS semiconductor devices and has particular applicability in fabricating high-density integration semiconductor devices with design features below about 0.18 $\mu$m, e.g., about 0.15 $\mu$m.

BACKGROUND OF THE INVENTION

The escalating requirements for high density and performance associated with ultra large scale integration (ULSI) semiconductor devices require design features below about 0.18 $\mu$m, e.g., about 0.15 $\mu$m and below, increased transistor and circuit speeds, high reliability, and increased manufacturing throughput for economic competitiveness. The reduction of design features to 0.18 $\mu$m and below challenges the limitations of conventional semiconductor manufacturing techniques.

As feature sizes of MOS and CMOS devices have decreased to the sub-micron range, so called "short-channel" effects have arisen which tend to limit device performance. For n-channel MOS transistors, the major limitation encountered is caused by hot-electron-induced instabilities. This problem occurs due to high electrical fields between the source and drain, particularly near the drain, such that charge carriers, either electrons or holes, are injected into the gate or semiconductor substrate. Injection of hot carriers into the gate can cause gate oxide charging and threshold voltage and thus reduce instabilities. Shallow junction, lightly- or moderately-doped source drain extension-type transistor structures have been developed.

For p-channel MOS transistors, the major "short-channel" effects which limits performance arise from "punch-through" effects which occur with relatively deep junctions. In such instances, there is a wider sub-surface depletion effect and it is easier for the field lines to go from the drain to the source, resulting in the above-mentioned "punch-through" current problems and device shorting. To minimize this effect, relatively shallow junctions are employed in forming p-channel MOS-type transistors.

The most satisfactory solution to date of hot carrier instability problems of MOS- and CMOS-type devices is the provision of lightly- or moderately-doped source/drain extensions driven just under the gate region, while the heavily-doped source/drain regions are laterally displaced away from the gate by use of a pair of spacers on opposite sidewalls of the gate. Such structures are particularly advantageous because they do not have problems with large lateral diffusion and the channel length can be set precisely.

However, in the case of MOS and CMOS devices, formation of junctions having desired characteristics (e.g., the spatial relationship between the impurity concentration peak and the lightly- or moderately-doped source/drain region) is problematic.

Thus a need exists for improved semiconductor manufacturing methodology for fabricating MOS and CMOS transistors which does not suffer from the above-described drawback associated with achieving a desired spatial relationship between the impurity concentration peak and the lightly- or moderately-doped source/drain region. Moreover, there exists a need for an improved process for fabricating transistor-based devices which permits capacitance between the lightly- or moderately-doped source/drain region and the semiconductor substrate to be modulated, which process is fully compatible with conventional process flow and provides increased manufacturing throughput and product yield.

The present invention fully addresses and solves the above-described drawback attendant upon conventional processing for forming submicron-dimensioned transistors for use in high-density integrated semiconductor devices, particularly in providing a process for forming a semiconductor device comprising a retrograde impurity profile having an impurity concentration peak wherein the distance between the depth of the peak and the lightly- or moderately-doped source/drain region can be precisely determined, thereby permitting modulation of the capacitance between the lightly- or moderately-doped source/drain region and the semiconductor substrate.

DISCLOSURE OF THE INVENTION

An advantage of the present invention is an improved method for forming a semiconductor device comprising a retrograde impurity profile having an impurity concentration peak wherein the distance between the depth of the peak and the lightly- or moderately-doped source/drain region can be precisely determined.

Another advantage of the present invention is a method of manufacturing a semiconductor device wherein capacitance between the lightly- or moderately-doped source/drain region and the semiconductor substrate can be modulated.

Additional advantages of the present invention will be set forth in the description which follows and in part will become apparent to those having ordinary skill in the art upon examination of the following or may be learned from the practice of the present invention. The objects and advantages of the invention may be realized and obtained as particularly pointed out in the appended claims.

According to the present invention, the foregoing and other advantages are achieved in part by a method of manufacturing a semiconductor device on a wafer, which method comprises:

ion implanting an impurity of a first conductive type into a main surface of a semiconductor substrate to form a retrograde impurity profile having an impurity concentration peak at a first depth below the main surface;

forming a gate stack comprising a gate oxide formed on the main surface, a gate electrode formed on the gate oxide, and side wall spacers formed on side surfaces of said gate oxide and gate electrode;

selectively etching to remove the sidewall spacers and a preselected depth of a surface portion of said substrate; and, ion implanting an impurity of a second conductive type into the etched surface of the substrate to form a lightly- or moderately-doped source/drain region.

Additional advantages of the present invention will become readily apparent to those skilled in this art from the following detailed description, wherein embodiments of the present invention are described simply by way of illustrating of the best mode contemplated in carrying out the present invention. As will be realized, the present invention is capable of other and different embodiments, and its several details are capable of modifications in various obvious respects, all without departing from the present invention. Accordingly, the drawings and description are to be regarded as illustrative in nature and not as restrictive.

DESCRIPTION OF THE INVENTION

Figure 1:
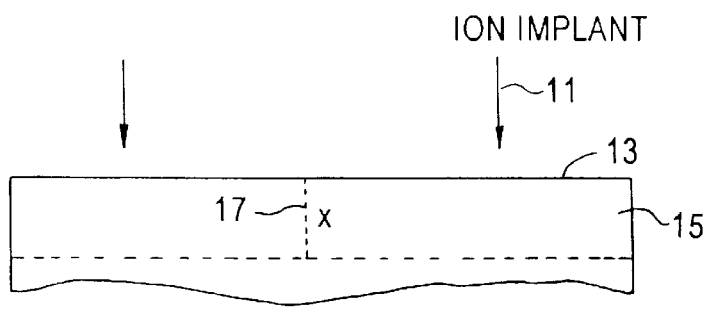
FIGS. 1–5 illustrate sequential phases of a method in accordance with an embodiment of the resent invention.

The present invention addresses and solves problems arising from manufacturing submicrondimensioned, MOS and CMOS transistors suitable for use in high-density integration semiconductor devices, wherein, as part of the fabrication methodology, an impurity of a first conductive type is implanted into a main surface of a semiconductor substrate. More specifically, the present invention advantageously provides a significant improvement in the ability to tailor the relationship between the depth of the concentration peak of a retrograde impurity profile and the lightly- or moderately-doped source/drain region. The inventive method thus increases device reliability and manufacturing throughput, while maintaining high channel mobility. In addition, the method of the present invention is fully compatible with other aspects of existing process methodology.

Advantageously, the purposely formed and strategically designed relationship between the depth of the concentration peak of a retrograde impurity profile and the lightly- or moderately-doped source/drain region permits capacitance between the lightly- or moderately-doped source/drain region and the semiconductor substrate to be modulated.

In accordance with embodiments of the present invention, a semiconductor device on a wafer is manufactured by: ion implanting an impurity of a first conductive type into a main surface of a semiconductor substrate to form a retrograde impurity profile having an impurity concentration peak at a first depth below the main surface; forming a gate stack comprising a gate oxide formed on the main surface, a gate electrode formed on the gate oxide, and side wall spacers formed on side surfaces of said gate oxide and gate electrode; selectively etching to remove the sidewall spacers and a preselected depth of surface portion of said substrate; and, ion implanting an impurity of a second conductive type into the etched surface of the substrate to form a lightly- or moderately-doped source/drain region.

An embodiment of the present invention is schematically illustrated in FIGS. 1–5, wherein similar reference numerals denote similar features. Adverting to FIG. 1, an impurity of a first conductive type is ion implanted 11 into a main surface 13 of a semiconductor substrate 15, e.g., n-type or intrinsic (i-type) monocrystalline silicon, to form a retrograde impurity profile having an impurity concentration peak at a first depth (x) 17 below the main surface 13. Implantation is performed under conditions (e.g., dosage, energy, and duration) for ion implanting a sufficient amount of impurities for providing a retrograde impurity profile having an impurity concentration peak at a first depth (x) 17 below the main surface 13. For example, In or Sb ions may be implanted at a dosage of from about 1E12 to about 5E13 atoms/$cm^2$ at an energy of from about 50 KeV to about 250 KeV. Given the present disclosure and the objectives of the present invention, the depth (x) 17 of the impurity concentration peak below the main surface can be optimized in a particular situation. In one embodiment of the present invention, said depth of said impurity concentration peak is from about 300 to about 1500 Å below the semiconductor wafer surface.

Figure 2:
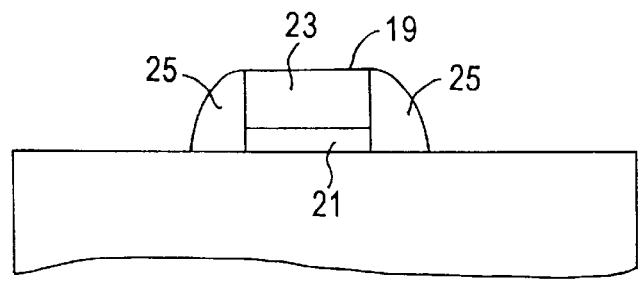

Referring now to FIG. 2, in a second step according to an embodiment of the present invention, a gate stack 19 is formed, comprising a gate oxide 21 formed on the main surface 13, a gate electrode 23 formed on the gate oxide, and side wall spacers 25 formed on side surfaces of said gate oxide and gate electrode. Formation of the gate stack 19 is effected by conventional photolithograpic and etching techniques, the conditions of which are conventional and hence, not elaborated upon herein.

Figure 3:
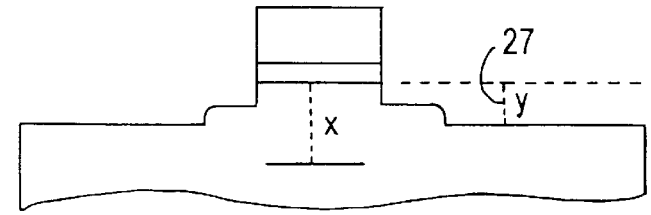

Referring to FIG. 3, the sidewall spacers and a preselected depth (y) 27 of a surface portion of the substrate 15 are selectively removed, as by etching. Given the present disclosure and the objectives of the present invention, the preselected depth (y) below the main surface can be optimized in a particular situation. In one embodiment, the preselected depth is from about 150 to about 1800 Å below the semiconductor wafer main surface. Selective removal of the sidewall spacers and the preselected depth (y) 27 of the surface portion of the substrate is effected by conventional etching techniques, the conditions of which are conventional and hence, not elaborated upon herein.

Figure 4:
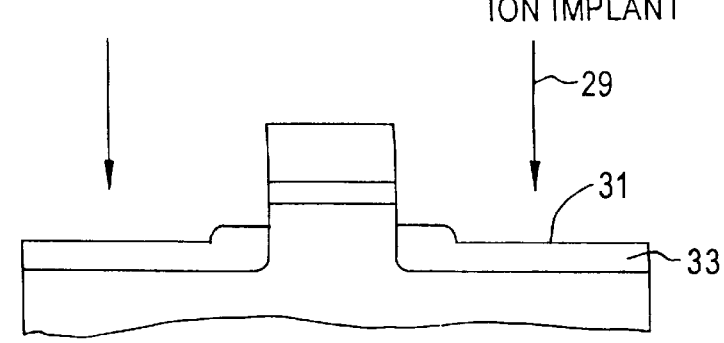

Adverting to FIG. 4, an impurity of a second conductive type is ion implanted 29 into the etched surface 31 of the semiconductor substrate 15, to form a lightly- or moderately-doped source/drain region 33 below the etched surface 31. Implantation is performed under conditions (e.g., dosage, energy, and duration) for ion implanting a sufficient amount of impurities to form a lightly- or moderately-doped source/drain region 33 below the etched surface 31. For example, As or $BF^2$ ions may be implanted at a dosage of from about 1E14 to about 4E15 atoms/$cm^2$ at an energy of from about 1 KeV to about 10 KeV to form the lightly- or moderately-doped source/drain region.

Figure 5:
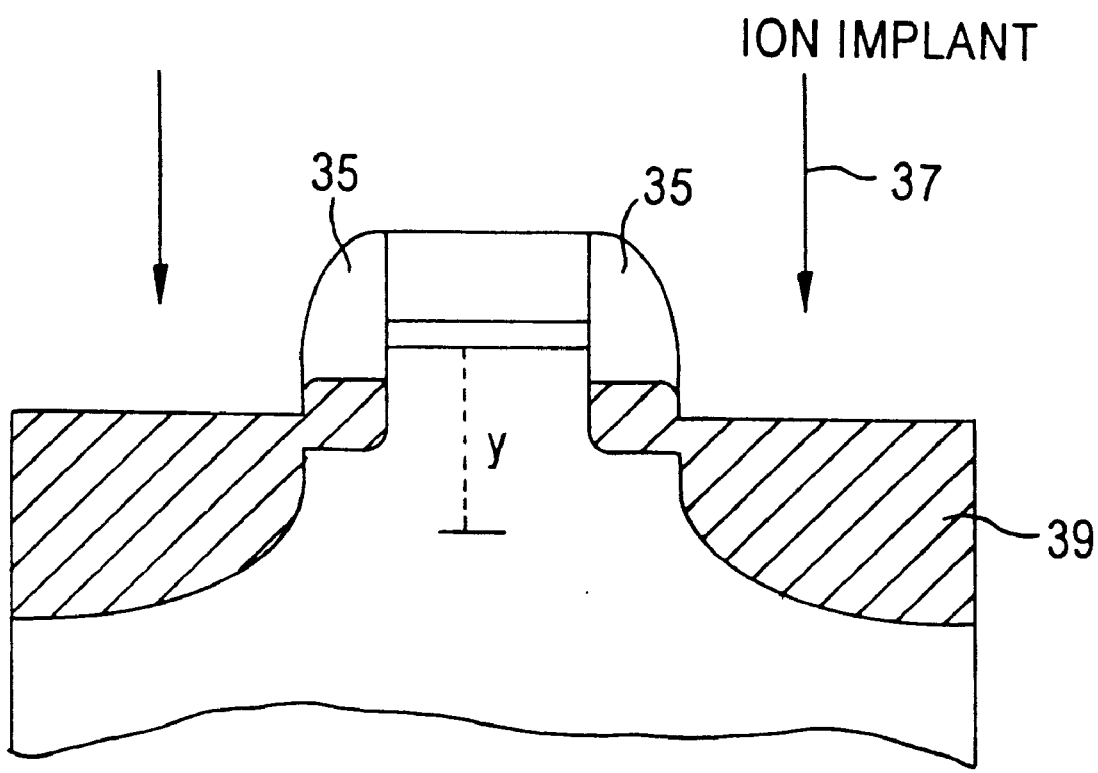

Adverting to FIG. 5, sidewall spacers 35 are re-formed on the side surfaces of said gate oxide and gate electrode. Thereafter, a further impurity of a second conductive type is ion implanted 37 into the etched surface 31 of the semiconductor substrate 15, to form a heavily-doped source/drain region 39 below the etched surface 31. Implantation is performed under conditions (e.g., dosage, energy, and duration) for ion implanting a sufficient amount of impurities to form the heavily doped region. For example, As or $BF^2$ ions may be implanted at a dosage of from about 1E15 to about 8E15 atoms/$cm^2$ at an energy of from about 10 KeV to about 50 KeV to form the heavily-doped source/drain region.

The present invention thus enables rapid, reliable formation of improved submicrondimensioned transistor devices at increased rates of manufacturing throughput, by utilizing a relatively simply process.

Finally, the present invention is applicable to the formation of other types of transistors and devices, and is fully compatible with conventional process flow for automated manufacture of high-density integration semiconductor devices.

In the previous descriptions, numerous specific details are set forth, such as specific materials, structures, chemicals, processes, etc., in order to provide a better understanding of the present invention. However, the present invention can be practiced without resorting to the details specifically set forth. In other instances, well-known processing structures have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. A method of manufacturing a semiconductor device on a wafer, which method comprises:

ion implanting an impurity of a first conductive type into a main surface of a semiconductor substrate to form a retrograde impurity profile having an impurity concentration peak at a first depth below the main surface;

forming a gate stack comprising a gate oxide formed on the main surface, a gate electrode formed on the gate oxide, and sidewall spacers formed on side surfaces of said gate oxide and gate electrode;

selectively etching to remove the sidewall spacers and a preselected depth of said surface portion of said substrate;

ion implanting an impurity of a second conductive type into the etched surface of the substrate to form a lightly- or moderately-doped source/drain region;

forming sidewall spacers on the gate electrode after forming the lightly- or moderately-doped source/drain region; and ion implanting an impurity of a second conductivity type into the etched surface of the substrate to form a heavily-doped source/drain region.

2. The method of claim 1, further comprising:

ion implanting In or Sb ions at a dosage of from about 1E12 to about 5E13 atoms/cm$^2$ at an energy of from about 50 KeV to about 250 KeV to form the retrograde impurity profile.

3. The method of claim 1, wherein said depth of said impurity concentration peak is from about 300 to about 1500 Å below the semiconductor wafer surface.

4. The method of claim 1, wherein the preselected depth is from about 150 to about 1800 Å below the semiconductor wafer main surface.

5. The method of claim 1, comprising:

implanting As or $BF_2$ ions at a dosage of from about 1E14 to about 4E15 atoms/cm$^2$ at an energy of from about 1 KeV to about 10 KeV to form the lightly- or moderately-doped source/drain region.

6. The method of claim 1, comprising:

implanting As or $BF_2$ ions at a dosage of from about 1E15 to about 8E15 atoms/cm$^2$ at an energy of from about 10 KeV to about 50 KeV to form the heavily-doped source/drain region.

7. A semiconductor device formed by the method according to claim 1.

* * * * *